US009455168B2

(12) United States Patent
Horio

(10) Patent No.: US 9,455,168 B2
(45) Date of Patent: Sep. 27, 2016

(54) BUFFER MATERIAL FOR PACKING WAFER CARRIER

(71) Applicant: SUMCO CORPORATION, Tokyo (JP)

(72) Inventor: Tomohiro Horio, Itoshima (JP)

(73) Assignee: SUMCO CORPORATION, Tokyo (JP)

( * ) Notice: Subject to any disclaimer, the term of this patent is extended or adjusted under 35 U.S.C. 154(b) by 308 days.

(21) Appl. No.: 13/943,249

(22) Filed: Jul. 16, 2013

(65) Prior Publication Data

US 2014/0227469 A1 Aug. 14, 2014

(30) Foreign Application Priority Data

Feb. 14, 2013 (JP) .................................. 2013-026265

(51) Int. Cl.
*B65D 81/02* (2006.01)
*H01L 21/673* (2006.01)

(52) U.S. Cl.
CPC ..... *H01L 21/67369* (2013.01); *B65D 2585/86* (2013.01); *Y10T 428/1376* (2015.01)

(58) Field of Classification Search
CPC ...... B65D 65/44; B65D 81/02; B65D 81/05; B65D 81/053; B65D 85/30; H01L 21/67326; H01L 21/673; H01L 21/67386; H01L 21/67369; B29K 2105/04; B32B 5/18
USPC ............... 206/710, 521, 523, 454, 711, 832; 211/41.18; 428/36.5
See application file for complete search history.

(56) References Cited

U.S. PATENT DOCUMENTS

| 5,642,813 A * | 7/1997 | Nyseth ........................... 206/597 |
|---|---|---|
| 5,706,951 A * | 1/1998 | Oinuma et al. ............... 206/710 |
| 5,875,896 A * | 3/1999 | Liang ............................ 206/710 |
| 6,131,739 A * | 10/2000 | Baier ............................ 206/710 |
| 6,786,334 B2 * | 9/2004 | Smith ........................... 206/592 |
| 6,817,161 B1 * | 11/2004 | Wu et al. ........................ 53/449 |
| 7,748,539 B2 * | 7/2010 | Onda et al. ................... 206/591 |
| 8,439,197 B2 * | 5/2013 | Yajima ................. B65D 81/133 206/454 |
| 8,720,693 B2 * | 5/2014 | Nagashima ................... 206/711 |
| 2001/0020595 A1 * | 9/2001 | Koike ........................... 206/521 |
| 2002/0195455 A1 * | 12/2002 | Takahashi et al. ........... 220/806 |
| 2003/0107187 A1 * | 6/2003 | Yajima et al. ................ 277/628 |
| 2004/0232036 A1 * | 11/2004 | Matsutori ......... H01L 21/67369 206/710 |
| 2005/0236298 A1 * | 10/2005 | Schwenk .......... H01L 21/67366 206/710 |
| 2006/0032785 A1 * | 2/2006 | Liu ............................... 206/710 |
| 2007/0181452 A1 * | 8/2007 | Imai .............................. 206/307 |
| 2008/0083643 A1 * | 4/2008 | Horio ............................ 206/586 |
| 2008/0296200 A1 * | 12/2008 | Horio ................... B65D 81/107 206/586 |

FOREIGN PATENT DOCUMENTS

JP     2007-137454     6/2007

* cited by examiner

*Primary Examiner* — Steven A. Reynolds
(74) *Attorney, Agent, or Firm* — Greenblum & Bernstein, P.L.C.

(57) ABSTRACT

At the time of packing a wafer carrier into a container, an upper buffer body and a lower buffer body are arranged above and below the wafer carrier. The wafer carrier has: a box-like carrier main body having a frame-like step portion formed on an upper inner peripheral surface of an access opening; and a lid body that closes the access opening in an openable manner when it is accommodated in the frame-like step portion through a gasket. Further, the upper buffer body has: an upper concave portion that accommodates an upper portion of the wafer carrier therein; and a pressing rib that is brought into contact with an upper end surface of a carrier main body and pressed against the upper end surface of the carrier main body without contacting with the lid body. Furthermore, the lower buffer body has: a lower concave portion and a support portion.

11 Claims, 12 Drawing Sheets

BUFFER MATERIAL FOR PACKING WAFER CARRIER

BACKGROUND OF THE INVENTION

1. Field of the Invention

The present invention relates to a buffer material used for packing a wafer carrier at the time of shipping of the wafer carrier in which a semiconductor wafer or the like is stored.

2. Description of the Related Art

In the prior art, there has been disclosed a packing body comprising a plurality of buffer bodies that sandwich contents therebetween and are accommodated in a packing box and a reinforcing body that reinforces at least one of these buffer bodies (for example, refer to Patent Document 1). The contents are a substrate carrier in which an opening portion of a carrier main body that contains a wafer is opened/closed by a lid body, and a retainer that holds a peripheral edge portion of the wafer is disposed to the lid body. Specifically, the substrate carrier has a carrier main body that accommodates a plurality of wafers in line, a detachable lid body that opens or closes an opened front side of this carrier main body, and a pair of left and right locking mechanisms that are attached to this lid body side by side and fit the lid body to this carrier main body or releases this fitted state. The pair of left and right locking mechanisms are configured in such a manner that locking claws protruding from a peripheral edge portion of the lid body are fitted into and locked with respect to a plurality of locking holes on a front inner periphery of the carrier main body based on an operation of a rotary plate at the time of fitting the lid body to the carrier main body and the locking claws fitted in the respective locking holes of the carrier main body are removed from the respective locking holes and returned to their original positions based on an operation of the rotary plate at the time of releasing the fitted state of the lid body with respect to the carrier main body.

The carrier main body is formed into a front open box type by using a resin. A robotic flange having a rectangular plane is detachably disposed at a central part of a ceiling of this carrier main body, and this robotic flange is held by an automatic carrying mechanism which is called "OHT (overhead hoist transfer)", thereby carrying the substrate carrier. Further, a pair of left and right rear retainers that hold a rear peripheral edge of each accommodated wafer are aligned and provided in the vertical direction on a rear wall inner surface of the carrier main body. Furthermore, the lid body is constituted by combining a resin housing and a plate. A deformable endless gasket is fitted to the peripheral edge portion of this lid body, and a large front retainer that elastically holds a front peripheral edge of each wafer accommodated in the carrier main body is attached to the central part on the rear side of the lid body in a vertically long manner. It is to be noted that the substrate carrier is put into a packing bag made of polyethylene, packed, and accommodated in a packing box with the opening portion of the carrier main body facing the upper side when wafers are not stored in the carrier main body, or the substrate carrier is put into the packing bag made of polyethylene, packed, then put into a packing bag made of aluminum as required, double-packed, and accommodated in the packing box with the opening portion of the carrier main body facing the upper side when the wafers are accommodated in the carrier main body.

On the other hand, the buffer body is a buffer material that can be fitted in contents. A peripheral wall of the buffer material is formed of an inner wall formed on a peripheral edge portion of the buffer material, a bulge portion that is formed on the inner wall and bulges outward, and an outer wall that is formed on this bulge portion and faces the inner wall of the buffer material to interpose a gap therebetween. Moreover, a peripheral edge portion of the reinforcing body is formed into a curved shape so that the peripheral edge portion of the reinforcing body can be engaged with an outer wall end portion of the buffer material. Additionally, a plurality of concave portions are formed on the peripheral wall of the buffer material in the circumferential direction at intervals, and the bulge portion of the buffer material is bent and formed into a bellows.

In the thus configured packing body packs, since contents are packed in the packing box through at least the buffer bodies and the reinforcing body, external force or impact shock acting on the packing body can be effectively absorbed, corner portions, ridge line portions, or the like of the packing bodies can be prevented from being easily damaged due to collision or fall, and possibilities that a peripheral area is contaminated, that a storage space expands, and that reuse or recycle is obstructed can be suppressed. Further, since the contents correspond to the substrate carrier in which the opening portion of the carrier main body that accommodates wafers is opened or closed by using the lid body, even in case of packing the substrate carrier with the retainers, impact shock at the time of collision or fall can be appropriately absorbed, and possibilities that the corner portions or ridge line portions of the packing body are easily damaged can be effectively eliminated. Furthermore, since the peripheral edge portion of the reinforcing body is bent and engaged with the outer wall end portion of the buffer material, the peripheral wall of the buffer material can be prevented from falling inward or outward or from being deformed, thus sufficiently protecting the contents. Moreover, since the plurality of concave portions are formed on the peripheral wall of the buffer material in the circumferential direction at intervals, strength or rigidity of the buffer bodies can be enhanced. Additionally, since the bulge portion of the peripheral wall of the buffer material is bent and formed into a soft bellows, expansion and contraction or bending of this bellows can alleviate the impact shock acting on the contents, and hence acceleration generated at the time of falling can be reduced.

Patent Document 1

Japanese Unexamined Patent Application Publication No. 2007-137454 (claims 1 and 3 to 6, paragraphs [0024] to [0028] and [0031] to [0035], FIG. 1 to FIG. 6)

In the packing body disclosed in Patent Document 1, first, the opening portion of the carrier main body is arranged sideways, a plurality of wafers are horizontally maintained and sequentially accommodated in the carrier main body from the opening portion in this state, and then the opening portion of this carrier main body is closed by the lid body. As a result, the plurality of wafers are extended in the horizontal direction and accommodated in the substrate carrier in the perpendicular direction at predetermined intervals. Subsequently, a direction of the substrate carrier is changed so that the opening portion of the carrier main body can face the upper side, and then this substrate carrier is put into the packing bag and packed in the packing box. Further, the plurality of packing boxes are aligned, stacked, and shipped in this state.

However, an experiment conducted by the present inventor revealed that an amount of particles adhering to a wafer surface in the substrate carrier increases in such a packing body (a buffer material) structure as disclosed in Patent Document 1.

As a result of keenly examining a cause, it can be assumed that, since the conventional packing body including such a packing body as disclosed in Patent Document 1 has a configuration that an upper surface of the lid body constituting the substrate carrier and the buffer material are in surface contact with each other, a load applied to the lid body through the buffer material varies when vibration or the like occurs during shipping, the lid body moves up and down with respect to the carrier main body as if the gasket (an elastic body) on the lower surface of the lid body breathes in the up and down directions with respect to the carrier main body, and friction occurs between the gasket on the lower surface of the lid body and the carrier main body, which leads to generation of particles. Furthermore, when the load applied to the upper surface of the lid body through the buffer material is excessively large, the lid body itself bends and deforms, air-tightness in the substrate carrier is lowered, and dust outside the substrate carrier may possibly enter the substrate carrier.

SUMMARY OF THE INVENTION

Accordingly, in view of the above-described problem, an object of the present invention is to provide a buffer material that prevents a load from transferring to a lid body even though vibration or the like occurs during shipping, and the present invention has been brought to completion.

According to a first aspect of the present invention, there is provided a buffer material for packing a wafer carrier, the buffer material comprising an upper buffer body and a lower buffer body that are arranged above and below a wafer carrier at the time of packing the wafer carrier in a container, the wafer carrier comprising: a box-like carrier main body that has an access opening formed in an upper surface thereof and a frame-like step portion formed on an upper inner peripheral surface of the access opening, and stores wafers therein; and a lid body that closes the access opening in an openable manner when it is accommodated in the frame-like step portion through a gasket, wherein the upper buffer body comprises: an upper concave portion that is formed on a lower surface thereof and accommodates an upper portion of the wafer carrier; and a pressing rib that is brought into contact with an upper end surface of the carrier main body and pressed against the upper end surface of the carrier main body without contacting the lid body, and the lower buffer body comprises: a lower concave portion that is formed on an upper surface thereof and accommodates a lower portion of the carrier main body; and a support portion that is brought into contact with the lower portion of the carrier main body and supports the lower portion of the carrier main body in the lower concave portion.

A second aspect of the present invention provides an invention based on the first aspect characterized in that a plurality of shock absorbing protrusions are provided to protrude on a lower surface of the lower buffer body, a plurality of temporary packing products each having the upper buffer body and the lower buffer body sandwiching the wafer carrier therebetween are fabricated, the temporary packing products are stacked and, when the shock absorbing protrusions of the upper temporary packing product come into contact with an upper surface of the upper buffer body of the lower temporary packing product, at least part of the contact region overlaps the upper end portion of the contact main body of the lower temporary packing product as seen in a planar view.

A third aspect of the present invention provides an invention based on the first aspect characterized in that an opening portion that enables visual confirmation of an upper surface of the wafer carrier therefrom is provided in the upper surface of the upper buffer body.

A fourth aspect of the present invention provides an invention based the first aspect characterized in that the upper concave portion of the upper buffer body is formed into a square shape as seen in a bottom view, and a notch is provided at each corner portion of the upper concave portion.

A fifth aspect of the present invention provides an invention based on the second aspect characterized in that, when the surface of the lower buffer body having the shock absorbing protrusions formed thereon and the surface of the upper buffer body having the upper concave portion formed thereon are arranged to overlap each other, the shock absorbing protrusions allowed to be stored in the upper concave portion.

A sixth aspect of the present invention provides an invention based on the fifth aspect characterized in that each of the shock absorbing protrusions of the lower buffer body is formed into an L-like shape as seen in a bottom view.

A seventh aspect of the present invention provides an invention based on the first aspect characterized in that each of the upper buffer body and the lower buffer body is made of foam of polyethylene, polypropylene, or polystyrene.

An eighth aspect of the present invention provides an invention based on the first aspect characterized in that the wafer carrier is a front opening shipping box.

In the buffer material for packing a wafer carrier, in a state that the upper buffer body and the lower buffer body are arranged above and below the wafer carrier containing wafers, namely, in a state that the lower portion of the wafer carrier is accommodated in the lower concave portion of the lower buffer body and the upper portion of the wafer carrier is accommodated in the upper concave portion of the upper buffer body, when these members are packed in the container and shipped, a load of the members placed in the container acts on the upper buffer body in the container through the flap of the container. However, since the pressing rib is in contact with the upper end surface of the carrier main body but not in contact with the lid body, the load acting on the upper buffer body is transmitted to the carrier main body, but it is not transmitted to the lid body. As a result, generation of particles due to friction between the frame-like step portion of the upper portion of the carrier main body and the gasket can be avoided, and penetration of the particles due to a reduction in air-tightness in the wafer carrier can be prevented.

In the buffer material for packing a wafer carrier according to the second aspect of the present invention, the wafer carrier is sandwiched and held between the upper buffer body and the lower buffer body, the plurality of temporary packing products are formed, these temporary packing products are aligned, stacked, and accommodated in the container, impact energy at the time of collision of the container with a floor is absorbed by crush of the shock absorbing protrusions of the lower buffer body when the container is accidentally dropped and the impact shock is applied to the container, and hence the wafer carrier and the wafer can be prevented from being damaged. Additionally, in the container, since each shock absorbing protrusion of the upper temporary packing product is in contact with the upper surface of the upper buffer body of the lower temporary packing product, at least a part of this contact region overlaps the upper end portion of the carrier main body of the lower temporary packing product as seen in a plan view, and hence the impact shock from the shock absorbing protrusion of the upper temporary packing product is transmitted to the upper end surface of the carrier main body through the pressing rib of the upper buffer body of the lower temporary packing product when the container is accidentally dropped and impact shock is applied to the container, but this impact shock is not transmitted to the lid body. As a result, since the lid body is not deformed, generation of the particles due to friction between the carrier main body and the gasket can be avoided, and penetration of the particles due to a reduction in air-tightness in the wafer carrier can be prevented.

In the buffer material for packing a wafer carrier according to the third aspect of the present invention, since the opening portion from which the upper surface of the wafer carrier can be visually confirmed is provided in the upper surface of the upper buffer body, presence/absence of the wafer carrier can be easily confirmed from this opening portion. Further, when the edge of the opening portion is grasped, the upper buffer body can be readily taken out of the container. Furthermore, the plurality of temporary packing products each having the wafer carrier sandwiched and held between the upper buffer body and the lower buffer body are produced, these temporary packing products are aligned, stacked, and accommodated in the container, and the formation of the opening portion can prevent the upper buffer body from coming into contact with the lid body even if large impact shock is applied to this container and the upper buffer body largely bends. As a result, since the lid body is not deformed, it is possible to avoid, e.g., generation of particles due to friction between the carrier main body and the gasket or penetration of particles caused due to a reduction in air-tightness in the wafer carrier.

In the buffer material for packing a wafer carrier according to the fourth aspect of the present invention, in a state that the wafer carrier is put in a bag formed of an aluminum thin film or a bag made of polyethylene, when this wafer carrier is sandwiched and held between the upper buffer body and the lower buffer body, surplus portions of the bag are produced at four corners of the wafer carrier by folding the bag and the like, and these surplus portions of the bag are accommodated in notches of the respective corner portions of the upper concave portion of the upper buffer body. As a result, when the wafer carrier is sandwiched and held between the upper buffer body and the lower buffer body, it is possible to avoid damage to the bag that is caused when the surplus portions of the bag are strongly brought into contact with the inner corners and dragged. Therefore, a reduction in quality of each wafer in the wafer carrier due to the damage to the bag can be prevented.

In the buffer material for packing a wafer carrier according to the fifth aspect of the present invention, since each shock absorbing protrusion of the lower buffer body can be accommodated in the upper concave portion of the upper buffer body, when each shock absorbing protrusion of the lower buffer body is accommodated in the upper concave portion of the upper buffer body, it is possible to reduce an area occupied by the upper buffer body and the lower buffer body at the time of shipping the upper buffer body and the lower buffer body alone.

In the buffer material for packing a wafer carrier according to the sixth aspect of the present invention, since each shock absorbing protrusion of the lower buffer body is formed into the L-like shape as seen in a bottom view, the lower buffer body can be prevented from being displaced from the upper buffer body when each shock absorbing protrusion of the lower buffer body is accommodated in the upper concave portion of the upper buffer body.

In the buffer material for packing a wafer carrier according to the seventh aspect of the present invention, since the upper buffer body and the lower buffer body are made of the foam of polyethylene, polypropylene, or polystyrene, the upper buffer body and the lower buffer body can efficiently absorb impact energy.

DETAILED DESCRIPTION OF THE PREFERRED EMBODIMENTS

Figure 1:
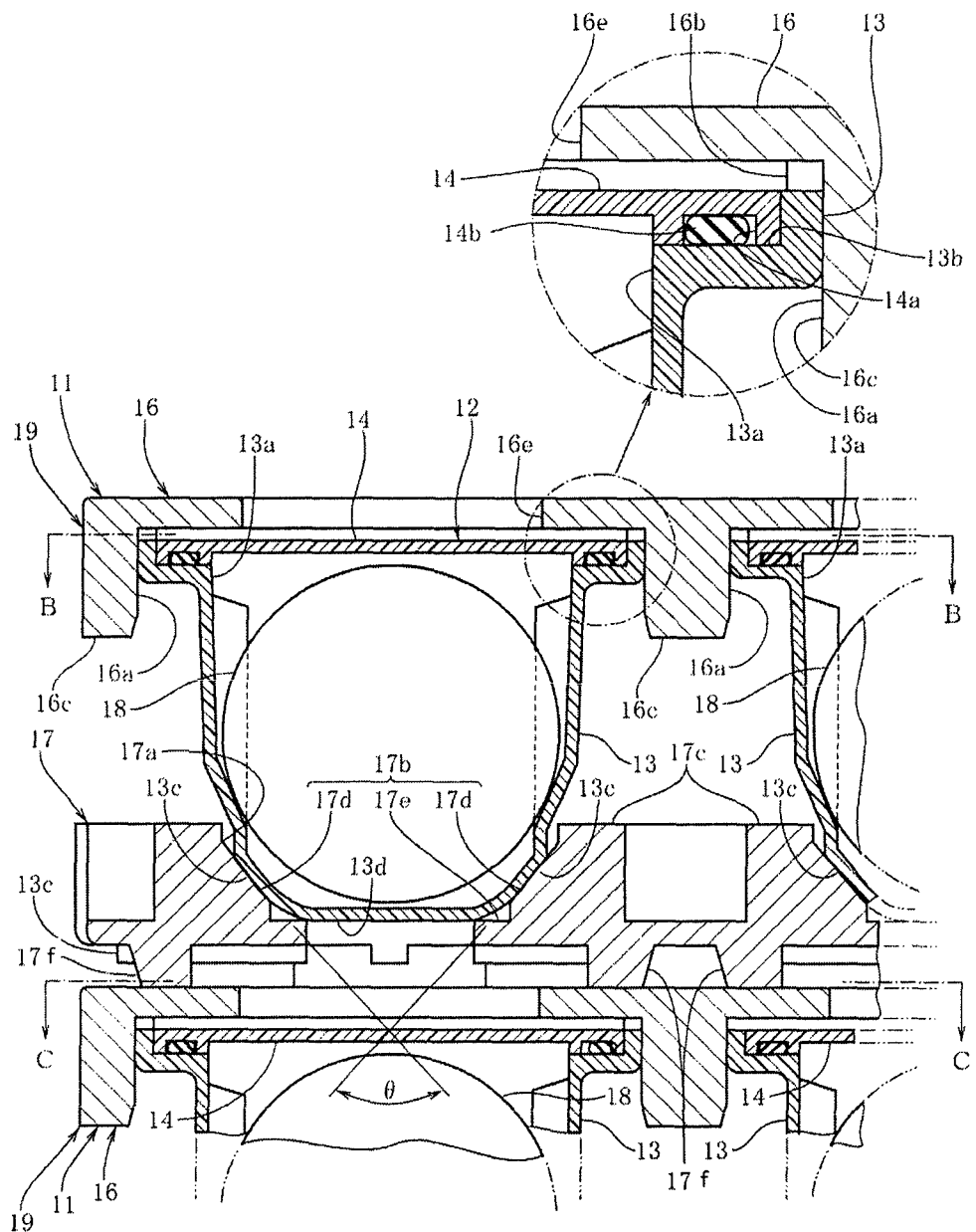
FIG. 1 is an enlarged cross-sectional view of a part A in FIG. 11 including a buffer material for packing a wafer carrier according to an embodiment of the present invention.
Figure 11:
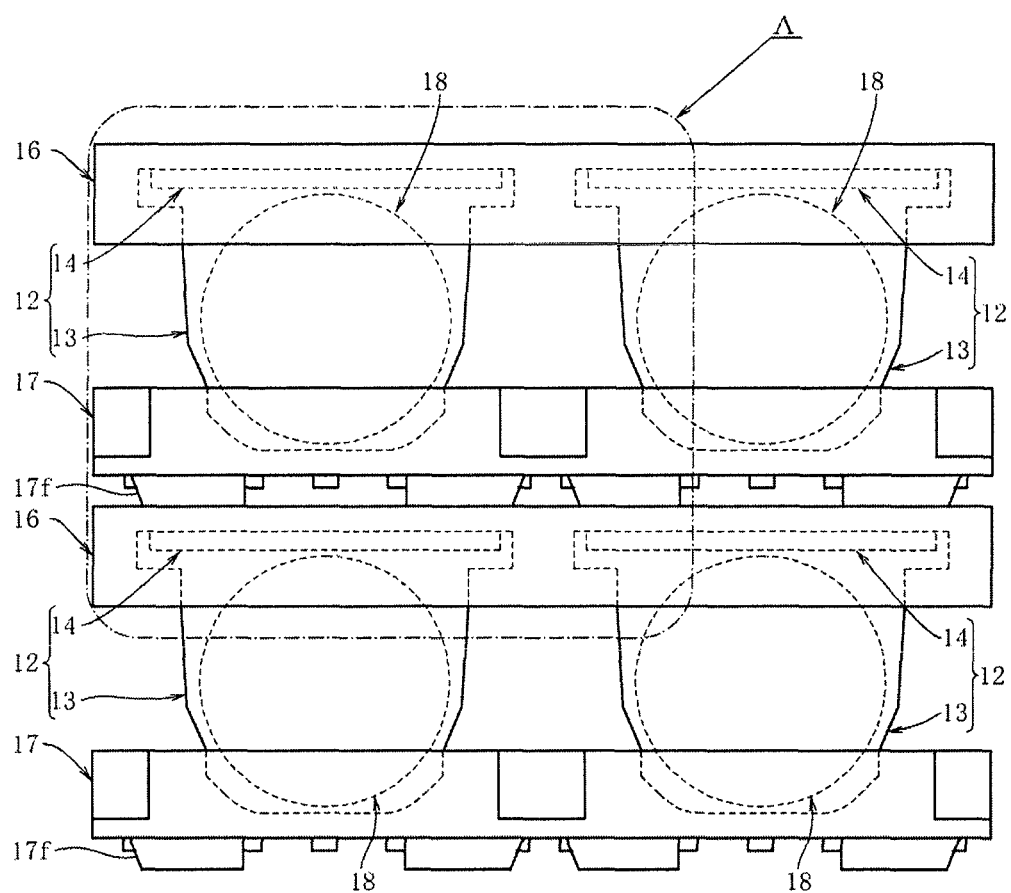
FIG. 11 is a front view showing a state that a plurality of temporary packing products each having a wafer carrier sandwiched and held by the buffer material are aligned and stacked.

Preferred embodiments according to the present invention are described with reference to the attached drawings hereinafter. As shown in FIG. 1 and FIG. 11, a wafer carrier packing buffer material 11 comprises an upper buffer body 16 and a lower buffer body 17 arranged above and below a wafer carrier 12. The wafer carrier 12 has a box-like carrier main body 13 that has an access opening 13*a* formed on an upper surface thereof and accommodates a wafer 18 therein and a lid body 14 that closes the access opening 13*a* in an openable manner. A frame-like step portion 13*b* is formed on an upper inner peripheral surface of the access opening 13*a* of this carrier main body 13, and an outer peripheral portion of the lid body 14 is configured to be accommodated in this frame-like step portion 13*b*. In this embodiment, the frame-like step portion 13*b* is concavely formed into a substantially-square-frame-like shape, and the lid body 14 is formed into a substantially-square-plate-like shape. Additionally, a substantially square concave groove 14a is formed on a lower surface of the outer peripheral portion of the lid body 14, and a gasket 14b having elasticity is inserted into this concave groove 14a. When the outer peripheral portion of the lid body 14 is accommodated in the frame-like step portion 13b and the lid body 14 closes the access opening 13a, a lower surface of the gasket 14b is pressure-welded with respect to a horizontal plane of the frame-like step portion 13b so that air-tightness in the wafer carrier 12 can be maintained. Further, a pair of container-side gradient surfaces 13c that are inclined to get closer to each other toward the lower side are formed on the lower portion of an outer surface of the carrier main body 13, respectively (FIG. 1). It is to be noted that the wafer 18 accommodated in the wafer carrier 12 is a semiconductor wafer having a diameter of 300 mm in this embodiment.

The wafer carrier 12 is a well-known front opening shipping box (FOSB) in this embodiment (FIG. 1 and FIG. 11). The FOSB is mainly used as a carrier for shipment of a wafer having a diameter of 300 mm and, although there are some structural differences depending on each manufacturer, a basic design configuration is standardized based on the SEMI standard. Here, the FOSB means a box such that the access opening 13a of the carrier main body 13 is arranged sideways, the plurality of wafers 18 are sequentially put into the carrier main body 13 from this access opening 13a while maintaining horizontality in this state, and then the access opening 13a of this carrier main body 13 is closed with the lid body 14. As a result, the plurality of wafers 18 are extended in the horizontal direction and accommodated in the wafer carrier 12 along the perpendicular direction at predetermined intervals in this state. However, as to this wafer carrier 12, a direction of the wafer carrier 12 is changed so that the access opening 13a of the carrier main body 13 faces the upper side, then this wafer carrier 12 is put into a bag (not shown) and packed in a container (not shown), and hence FIG. 1 and FIG. 11 show the carrier main body 13 with the access opening 13a facing the upper side. Therefore, in this specification, each constituent component is explained based on a state that the access opening 13a of the carrier main body 13 faces the upper side. It is to be noted that the wafer carrier has been described as the FOSB in this embodiment, but the buffer material according to this invention can be also applied to a box which is of a type that an access opening of a carrier main body is arranged to face upward, a plurality of wafers are sequentially put into a carrier main body from this access opening while maintaining perpendicularity in this state, and then the access opening of this carrier main body is closed using a lid body or a box which is of any other type. Furthermore, even if a lock mechanism (not shown) of the lid body for the carrier main body is a dial lock mechanism (an automatic type or a manual type) or any other lock mechanism, the buffer material according to the present invention can be applied to the wafer carrier having such a lock mechanism.

Figure 7:
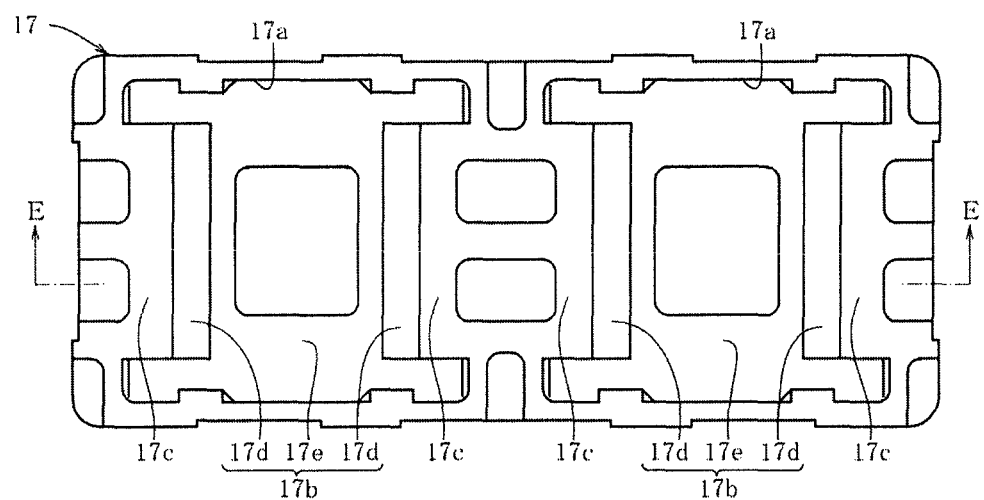
FIG. 7 is a plan view of a lower buffer body of the buffer material.
Figure 8:
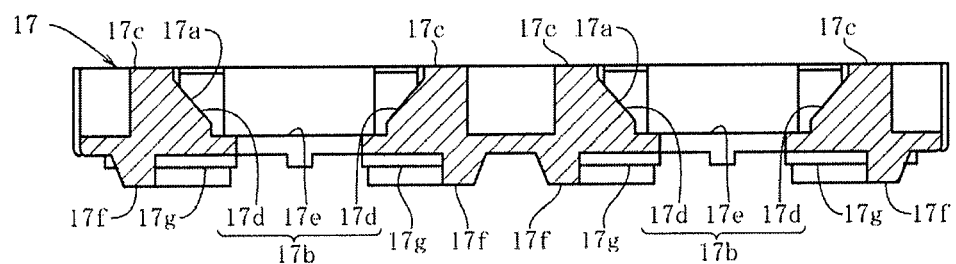
FIG. 8 is a cross-sectional view taken along a line E-E in FIG. 7.

On the other hand, the upper buffer body 16 has an upper concave portion 16a that is formed on a lower surface thereof and accommodates an upper portion of the wafer carrier 12 and a pressing rib 16b formed in this upper concave portion 16a (FIG. 1, FIG. 2, FIG. 5, and FIG. 6). Moreover, the lower buffer body 17 has a lower concave portion 17a that is formed on an upper surface thereof and accommodates a lower portion of the carrier main body 13 and a support portion 17b that is in contact with the lower portion of the carrier main body 13 in this lower concave portion 17a and supports the lower portion of the carrier main body 13 (FIG. 1, FIG. 7, and FIG. 8). In this embodiment, two upper concave portions 16a and 16a are formed on the lower surface of the upper buffer body 16 along the longitudinal direction of this upper buffer body 16 at a predetermined interval (FIG. 5 and FIG. 6), and two lower concave portions 17a and 17a are formed on the upper surface of the lower buffer body 17 along the longitudinal direction of the lower buffer body 17 at a predetermined interval (FIG. 7 and FIG. 8). That is, the single upper buffer body 16 and the single lower buffer body 17 can be used so that the two wafer carriers 12 and 12 can be held. It is to be noted that, in this embodiment, the two upper concave portions and the two lower concave portions are formed on the upper buffer body and the lower buffer body, respectively, but one upper concave portion and one lower concave portion may be formed on the upper buffer body and the lower buffer body, respectively, or three upper concave portions and three lower concave portions may be formed on the upper buffer body and the lower buffer body, respectively, or four upper concave portions and four lower concave portions may be formed on the upper buffer body and the lower buffer body, respectively.

It is preferable to form the upper buffer body 16 and the lower buffer body 17 with use of foam of polyethylene, polypropylene, or polystyrene (FIG. 1 and FIG. 4 to FIG. 9). Further, it is preferable for an expansion ratio of the foam to fall in the range of 20 to 50 times.

Figure 2:
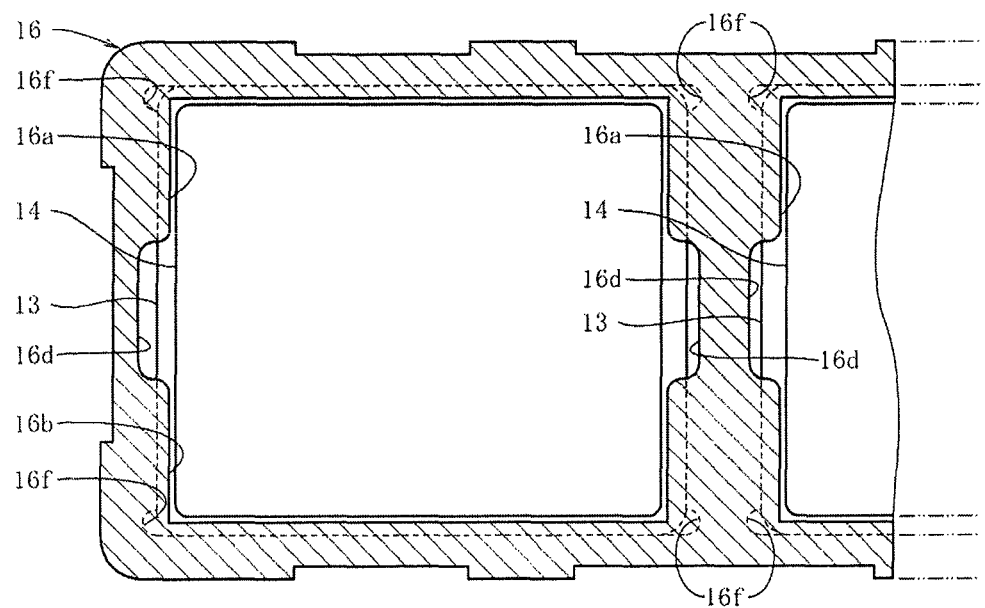
FIG. 2 is a cross-sectional view taken along a line B-B in FIG. 1.
Figure 5:
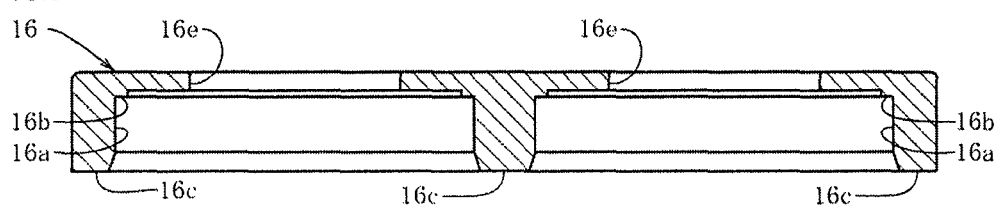
FIG. 5 is a cross-sectional view taken along a line D-D in FIG. 6.
Figure 6:
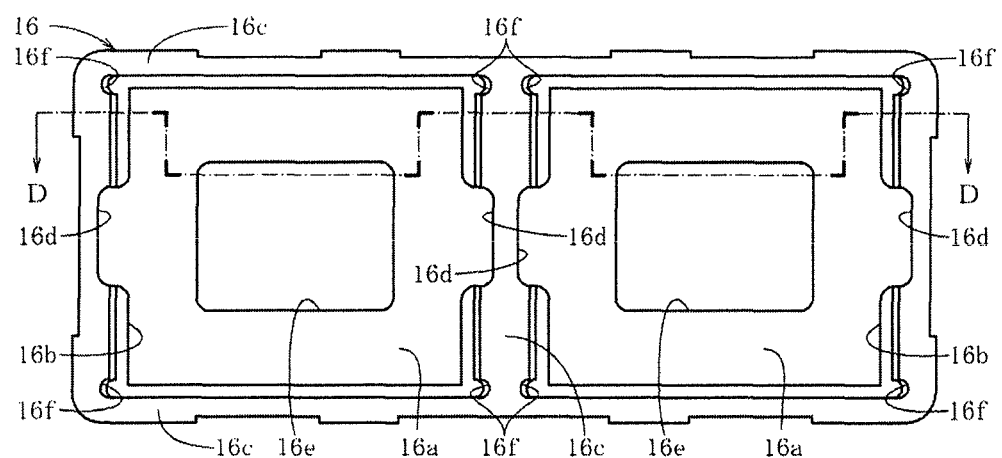
FIG. 6 is a bottom view of the upper buffer body.

Each of the upper concave portions 16a and 16a of the upper buffer body 16 is formed into a square shape as seen in a bottom view, namely, formed into a quadrangular prism shape having a relatively shallow depth (FIG. 1, FIG. 5 and FIG. 6). Further, the pressing rib 16b is configured to come into contact with an upper end surface of the carrier main body 13 and to be pressed against the upper end surface of the carrier main body 13 without coming into contact with the lid body 14 when the upper portion of the wafer carrier 12 is stored in the upper concave portion 16a (FIG. 1). That is, the pressing rib 16b is provided along an inner surface of a peripheral wall 16c that is continuous with the upper surface of each upper concave portion 16a in this upper surface (FIG. 1, FIG. 2, FIG. 5 and FIG. 6). In this embodiment, the pressing rib 16b is provided along the inner surface of the peripheral wall 16c that is continuous with the upper surface of the upper concave portion 16a in this upper surface except a pair of depressed portions 16d and 16d (FIG. 6) formed on the inner surface of the peripheral wall 16c. A thickness of this pressing rib 16b is adjusted so that it does not come into contact with the lib body 14. Furthermore, two opening portions 16e and 16e, from which the upper surface of the upper portion of the wafer carrier 12 accommodated in the upper concave portion 16a can be visually confirmed, are provided in the upper surface of the upper buffer body 16 (FIG. 1 and FIG. 4 through FIG. 6). Each of the opening portions 16e and 16e is formed into a substantially-square-like shape at a substantial center of each upper concave portion 16a or 16a. Additionally, a notch 16f which extends in the depth direction of the upper concave portion 16a and has a relatively small radius of curvature is provided at each corner portion of the upper concave portion 16a (FIG. 2, FIG. 3, and FIG. 6).

Each lower concave portion 17a of the lower buffer body 17 is formed into a substantially-I-like shape as seen in a planar view (FIG. 7). Further, the support portion 17b of the lower buffer body 17 is formed of a pair of concave portion-side gradient surfaces 17d and 17d that are formed on the peripheral surface 17c constituting the lower concave portion 17a to face each other and get closer to each other toward the lower side and a concave portion-side bottom surface 17e placed between the pair of concave portion-side gradient surfaces 17d and 17d (FIG. 1, FIG. 7, and FIG. 8). When the lower portion of the wafer carrier 12 is accommodated in the lower concave portion 17a of the lower buffer body 17, a pair of container-side gradient surfaces 13c and 13c of the carrier main body 13 come into contact with the pair of concave portion-side gradient surfaces 17d and 17d, the pair of concave portion-side gradient surfaces 17d and 17d support the lower portion of the outer surface of the carrier main body 13, a bottom surface 13d of the carrier main body 13 comes into contact with the concave portion-side bottom surface 17e, and the concave portion-side bottom surface 17e supports the bottom surface 13d of the carrier main body 13. As a result, the lower buffer body 17 can hold the lower portion of the carrier main body 13 in a stable state. In addition, it is preferable to set an angle θ formed between the pair of concave portion-side gradient surfaces 17d and 17d to coincide with an angle θ formed between the pair of container-side gradient surfaces 13c and 13c (FIG. 1).

Figure 3:
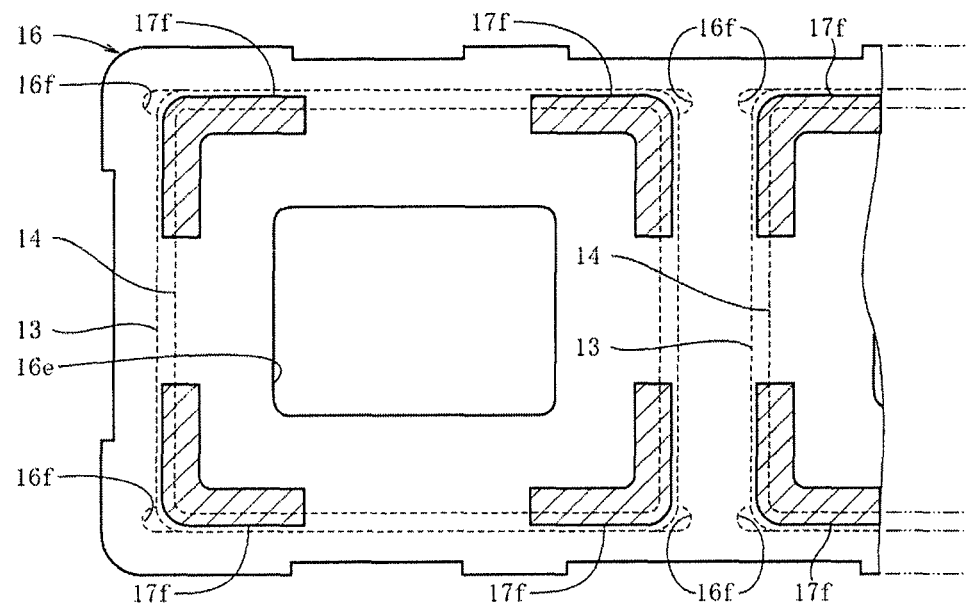
FIG. 3 is a cross-sectional view taken along a line C-C in FIG. 1.
Figure 4:
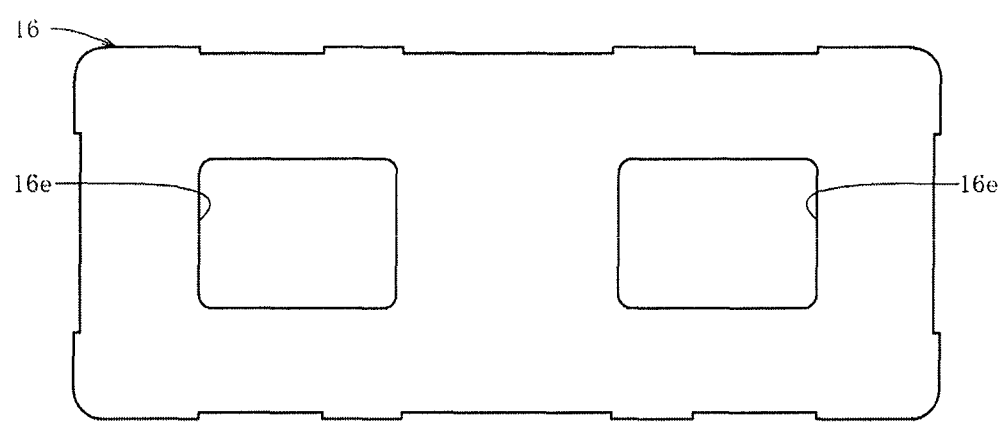
FIG. 4 is a plan view of an upper buffer body of the buffer material.
Figure 9:
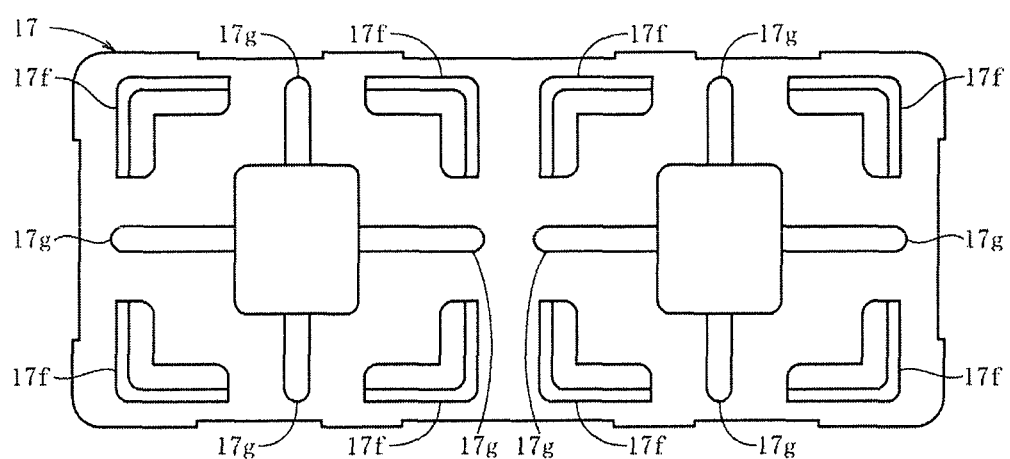
FIG. 9 is a bottom view of the lower buffer body.

Further, a plurality of shock absorbing protrusions 17f are provided to protrude on the lower surface of the lower buffer body 17 (FIG. 1, FIG. 3, FIG. 8, and FIG. 9). In this embodiment, four shock absorbing protrusions 17f are formed in accordance with each lower concave portion 17a (FIG. 9). Each of the shock absorbing protrusions 17f is formed into an L-like shape as seen in a bottom view, and these L-shaped shock absorbing protrusions 17f form a substantially square frame having each side disconnected at the center. Furthermore, a plurality of temporary packing products 19 each having the wafer carrier 12 sandwiched between the upper buffer body 16 and the lower buffer body 17 are fabricated, and these temporary packing products 19 are stacked. When the shock absorbing protrusions 17f of the upper temporary packing product 19 come into contact with the upper surface of the upper buffer body 16 of the lower temporary packing product 19, at least part of this contact region overlaps the upper end portion of the carrier main body 13 of the lower temporary packing product 19 as seen in a planar view (FIG. 3). Moreover, each shocking absorbing protrusion 17f is formed into a taper shape whose thickness is gradually reduced toward the lower side (FIG. 1, FIG. 8, and FIG. 9).

Figure 10:
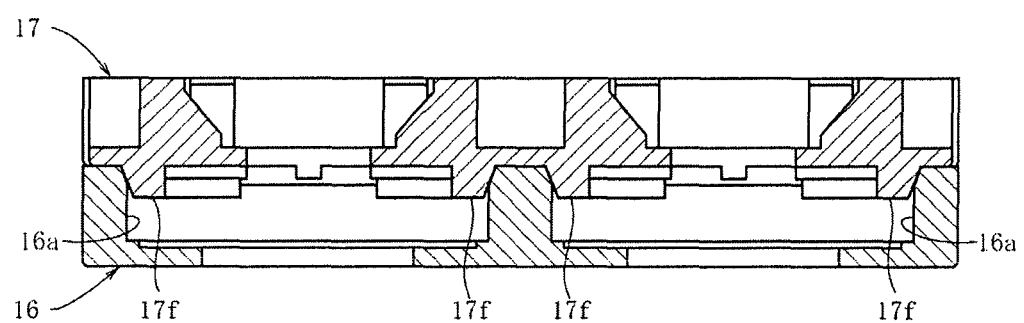
FIG. 10 is a longitudinal cross-sectional view of the upper buffer body and the lower buffer body showing a state that a lower surface of the lower buffer body is arranged to overlap an upper surface of the overturned upper buffer body and shock absorbing protrusions of the lower buffer body are accommodated in upper concave portions of the upper buffer body.

On the other hand, when the surface of the lower buffer body 17 having the shock absorbing protrusions 17 formed thereon and the surface of the upper buffer body 16 having the upper concave portions 16a formed thereon overlap each other, the shock absorbing protrusions 17f can be accommodated in the respective upper concave portions 16a (FIG. 10). Additionally, it is desirable to set a depth of the upper concave portion 16a to be equal to or longer than a length of the shock absorbing protrusion 17f. As a result, when the surface of the lower buffer body 17 having the shock absorbing protrusions 17 formed thereon and the surface of the upper buffer body 16 having the upper concave portions 16a formed thereon overlap each other, both the members can overlap each other without a gap, and a space can be conserved at the time of collecting the buffer material. It is preferable for the depth of the upper concave portion 16a of the upper buffer body 16 to fall within the range of 30 to 100 mm. Here, the depth of the upper concave portion 16a of the upper buffer body 16 is restricted to the range of 30 to 100 mm because the carrier main body 13 may not be sufficiently held in the horizontal direction if the depth is less than 30 mm and the upper buffer body 16 may interfere with a side handle or the like disposed at the central portion of the side surface of the carrier main body 13 when the depth exceeds 100 mm. It is to be noted that reference sign 17g in FIG. 8 and FIG. 9 denotes a reinforcing rib configured to reinforce the bottom surface 17e of the lower buffer body 17.

Usage of the thus configured wafer carrier packing buffer material 11 will now be described. First, in a state that the access opening 13a of the carrier main body 13 of the wafer carrier 12 is arranged sideways, the plurality of wafers 18 are sequentially put into the carrier main body 13 from this access opening 13a while maintaining horizontality, and then the access opening 13a of this carrier main body 13 is closed by the lid body 14. As a result, the plurality of wafers 18 are stored in the wafer carrier 12 in the perpendicular direction at predetermined intervals while extending in the horizontal direction. Further, the air-tightness between the access opening 13a of the carrier main body 13 and the lid body 14 is maintained by the gasket 14b having the elasticity. Subsequently, a direction of the wafer carrier 12 is changed so that the access opening 13a of the carrier main body 13 can face the upper side, and then this wafer carrier 12 is put into a bag formed of an aluminum thin film or a bag made of polyethylene. At this time, although surplus portions of the bag are generated at four corners of the wafer carrier 12 due to, e.g., fold of the bag, these surplus portions of the bag are accommodated in the notches 16f at the respective corner portions of the upper concave portion 16a of the upper buffer body 16. As a result, when the wafer carrier 12 is sandwiched and held between the upper buffer body 16 and the lower buffer body 17, it is possible to avoid damage to the bag caused when the surplus portions of the bag are strongly brought into contact with the inner corners of the upper buffer body and dragged.

Then, the upper buffer body 16 and the lower buffer body 17 are arranged above and below the two wafer carriers 12 and 12, the two wafer carriers 12 and 12 are sandwiched between the upper buffer body 16 and the lower buffer body 17 from the upper and lower sides, and the temporary packing product 19 is fabricated. Specifically, the lower portions of the two wafer carriers 12 and 12 are stored in the two lower concave portions 17a and 17a of the lower buffer body 17, then the upper concave portions 16a and 16a of the upper buffer body 16 are fitted onto the upper portions of the wafer carriers 12 and 12, and the temporary packing product 19 is fabricated. At this time, the pressing rib 16b formed in each upper concave portion 16a of the upper buffer body 16 is brought into contact with the upper end surface of the carrier main body 13 and pressed against the upper end surface of the carrier main body 13 without contacting with the lid body 14. Furthermore, the temporary packing product 19 is stored in the flapped container formed of cardboard, whereby a packing product (not shown) is fabricated. Here, the container is configured to be capable of accommodating the two, four, eight, 12, or more wafer carriers.

In case of storing, e.g., the two wafer carriers 12 and 12 in the container and shipping them, a load of an object (e.g., another container) placed in this container acts on the upper buffer body 16 in the container through a flap of the container. However, since the pressing rib 16b is in contact with the upper end surface of the carrier main body 13 but it is not in contact with the lid body 14, the load acting on the upper buffer body 16 is transferred to the carrier main body 13, but it is not transferred to the lid body 14. As a result, even if vibration or the like occurs during the shipping, friction between the frame-like step portion 13b of the carrier main body 13 and the gasket 14b is suppressed, generation of particles can be avoided, and penetration of the particles due to a reduction in air-tightness in the wafer carrier 12 can be also prevented.

Moreover, when the container storing the two wafer carriers 12 and 12 are accidentally dropped and impact is applied to the container, since impact energy at the time of collision of the container with a floor is absorbed by crush of the shock absorbing protrusions 17*f* of the lower buffer body 17 made of foam of polyethylene or the like, gravitational acceleration of falling is alleviated, and the wafer carrier 12 and the wafers 18 can be prevented from being damaged. Here, since each shock absorbing protrusion 17*f* is formed into a taper shape whose thickness is gradually reduced toward the lower side, the shock absorbing protrusion 17*f* is crushed from a portion with a small thickness. As a result, since the impact energy can be efficiently absorbed and the gravitational acceleration of falling can be alleviated, damage to the wafer carrier 12 and the wafer 18 can be effectively avoided.

On the other hand, in case of storing, e.g., eight wafer carriers 12 in the container and shipping them, i.e., in case of storing two wafer carriers 12 in each of two columns and each of two stages in the container and shipping them, a load of each upper temporary packing product 19 acts on the upper buffer body 16 of each lower temporary packing product 19. However, in each lower temporary packing product 19, the pressing rib 16*b* of the upper buffer body 16 is in contact with the upper end surface of the carrier main body 13 but not in contact with the lid body 14, and hence the load acting on the upper buffer body 16 is transferred to the carrier main body 13 but not transferred to the lid body 14. As a result, even if vibration or the like occurs during shipping, since relative vibration or the like of the lid body 14 does not occur with respect to the contain main body 13, a reduction in air-tightness in the wafer carrier 12 can be avoided, and dust can be prevented from entering the wafer carrier 12.

Additionally, each shock absorbing protrusion 17*f* of each upper temporary packing product 19 comes into contact with the upper surface of the upper buffer body 16 of each lower temporary packing product 19, and at least part of this contact region overlaps the upper end portion of the carrier main body 13 of each lower temporary packing product 19 as seen in a planar view. At this time, for example, if the container is accidentally dropped and impact is applied to the container, impact force from each shock absorbing protrusion 17*f* of each upper temporary packing product 19 is transferred to the upper end surface of the carrier main body 13 through the pressing rib 16*b* of the upper buffer body 16 of each lower temporary packing product 19, but it is not transferred to the lid body 14. As a result, since the lid body 14 is not deformed, namely, since relative deformation of the lid body 14 for the carrier main body 13 does not occur, a reduction in air-tightness in the wafer carrier 12 can be avoided, and dust can be prevented from entering the wafer carrier 12. Further, even if large impact is applied to the container and the upper buffer body 16 greatly bends, formation of the opening portion 16*e* in the upper buffer body 16 enables avoiding contact of the upper buffer body 16 with the lid body 14. As a result, since the lid body 14 is not deformed, namely, since the relative deformation of the lid body 14 for the carrier main body 13 does not occur, a reduction in air-tightness in the wafer carrier 12 can be avoided, and dust can be prevented from entering the wafer carrier 12.

On the other hand, since the upper surface of the wafer carrier 12 can be visually confirmed from the opening portion 16*e* of the upper buffer body 16, at the time of packing the wafer carrier 12 into the container or taking out the same from the container, presence/absence of the wafer carrier 12 can be confirmed from this opening portion 16*e*. Moreover, at the time of taking out the wafer carrier 12 from the container, the upper buffer body 16 can be easily taken out of the container by grasping the edge of the opening portion 16*e*. Additionally, at the time of returning the upper buffer body 16 and the lower buffer body 17 after completion of shipping of the wafer carrier 12, when each shock absorbing protrusion 17*f* of the lower buffer body 17 is accommodated in the upper concave portion 16*a* of the upper buffer body 16, a volume occupied by the upper buffer body 16 and the lower buffer body 17 can be reduced. At this time, since the depth of the upper concave portion 16*a* is formed to be equal to or longer than the length of each shock absorbing protrusion 17*f*, the shock absorbing protrusions 17*f* of the lower buffer body 17 can be all accommodated in the upper concave portion 16*a* of the upper buffer body 16. Further, since each shock absorbing protrusion 17*f* of the lower buffer body 17 is formed into the L-like shape as seen in a bottom view, when the shock absorbing protrusions 17*f* of the lower buffer body 17 are accommodated in the upper concave portion 16*a* of the upper buffer body 16, the lower buffer body 17 can be prevented from being displaced with respect to the upper buffer body 16. The upper buffer body 16 and the lower buffer body 17 can be compactly shipped. As described above, the upper buffer body 16 and the lower buffer body 17 according to the present invention can be repeatedly used.

EXAMPLE

Next, examples according to the present invention are explained together with comparative examples.

Example 1

As shown in FIG. 1, first, 25 semiconductor wafers 18 having a diameter of 300 mm were stored in each of two wafer carriers 12 and 12 each having an access opening 13*a* arranged sideways, and each access opening 13*a* was closed with a lid body 14. At this time, air-tightness between the access opening 13*a* of a carrier main body 13 and the lid body 14 is maintained by a gasket 14*b* having elasticity. Then, the access opening 13*a* of each of these wafer carriers 12 was set to face the upper side, then an upper buffer body 16 and a lower buffer body 17 were arranged above and below each of these wafer carriers 12, and the two wafer carriers 12 and 12 were sandwiched between the upper buffer body 16 and the lower buffer body 17 from the upper and lower sides, whereby a temporary packing product 19 was fabricated. Specifically, lower portions of the two wafer carriers 12 and 12 were stored in two lower concave portions 17*a* and 17*a* of the lower buffer body 17, then upper concave portions 16*a* and 16*a* of the upper buffer body 16 were fitted in the upper portions of these wafer carriers 12 and 12, and the temporary packing product 19 was fabricated. At this time, a pressing rib 16*b* formed in each upper concave portion 16*a* of the upper buffer body 16 is brought into contact with the upper end surface of the carrier main body 13 and pressed against the upper end surface of the carrier main body 13 without contacting the lid body 14. Furthermore, the temporary packing product 19 is accommodated in a container made of cardboard, thus fabricating a packing product. This packing product was determined as Example 1. It is to be noted that two temporary packing products 19 are stacked in two stages in FIG. 1, but one temporary packing product 19 (two wafer carriers) was stored in a single container in this example.

Comparative Example 1

A packing product was fabricated like Example 1 except that an upper buffer body having no pressing rib formed thereon was used. This packing product was determined as Comparative Example 1. In the packing product according to this Comparative Example 1, an upper surface of each upper concave portion of the upper buffer body is brought into contact with a lid body, also brought into contact with an upper end surface of a carrier main body, and pressed against the upper end surface of the carrier main body.

Comparative Example 1 and Evaluation

A vibration acceleration test was conducted with respect to the packing products according to Example 1 and Comparative Example 1. Specifically, each of the packing products according to Example 1 and Comparative Example 1 was placed on a vibration test system (G8820 manufactured by Shinken Co., Ltd.), and variable vibration in the range of 5 to 50 Hz was applied to each packing product for 60 minutes. However, an amplitude of each frequency was adjusted so that acceleration can be 0.75 G. Further, each of a time required for gradually increasing each frequency from 5 Hz to 50 Hz and a time required for gradually reducing the same from 50 Hz to 5 Hz was set to seven minutes. Furthermore, the number of particles increased in the wafer carrier was measured by a surface analyzer (SP-2 manufactured by KLA-Tencor). Table 1 shows a result. It is to be noted that the number of particles increased in the wafer carrier was calculated by subtracting the number of particles measured before the vibration acceleration test from the number of particles measured after the vibration acceleration test.

Figure 12:
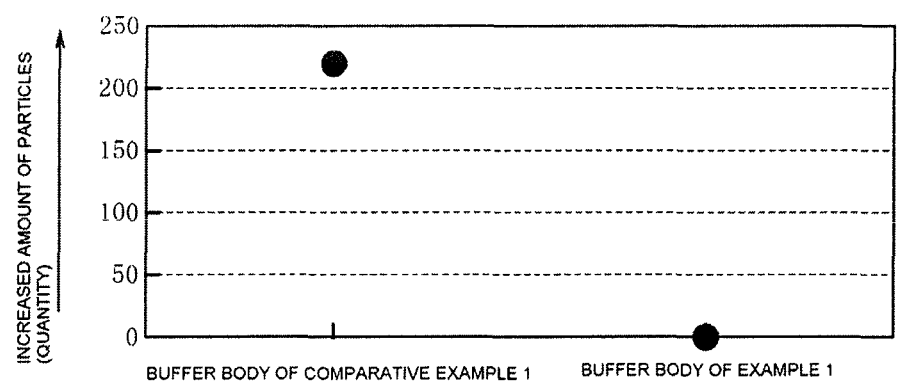
FIG. 12 is a view showing an increased amount of particles per wafer when a vibration test was conducted while holding each wafer carrier by using the buffer material according to each of Example 1 and Comparative Example 1.

As obvious from FIG. 12, the number of particles in the wafer carrier was increased by approximately 220 in Comparative Example 1, whereas the number of particles in the wafer carrier was not increased at all in Example 1.

What is claimed is:

1. A buffer material for packing a wafer carrier, the buffer material comprising an upper buffer body and a lower buffer body that are arranged above and below a wafer carrier at the time of packing the wafer carrier in a container, the wafer carrier comprising: a box-like carrier main body that has an access opening formed in an upper surface thereof and a frame-like step portion formed on an upper inner peripheral surface of the access opening, and stores wafers therein; and a lid body that closes the access opening in an openable manner when it is accommodated in the frame-like step portion through a gasket,
    wherein the upper buffer body is composed so as not to be in contact with the lid body directly or indirectly, the upper buffer body comprises: an upper concave portion that is formed on a lower surface thereof and accommodates an upper portion of the wafer carrier; a peripheral wall defining the upper concave portion; and a pressing rib pressed against the upper end surface of the carrier main body without contacting the lid body, and
    the lower buffer body comprises: a lower concave portion that is formed on an upper surface thereof and accommodates a lower portion of the carrier main body; and a support portion that is brought into contact with the lower portion of the carrier main body and supports the lower portion of the carrier main body in the lower concave portion, and
    wherein the pressing rib extends downwardly from an upper surface of the concave portion along an inner surface of the peripheral wall and includes a lower end surface brought into direct contact with only an upper end surface of the carrier main body.

2. The buffer material according to claim 1, wherein a plurality of shock absorbing protrusions are provided to protrude on a lower surface of the lower buffer body, a plurality of temporary packing products each having the upper buffer body and the lower buffer body sandwiching the wafer carrier therebetween are fabricated, the temporary packing products are stacked and, when the shock absorbing protrusions of the upper temporary packing product come into contact with an upper surface of the upper buffer body of the lower temporary packing product, at least part of the contact region overlaps the upper end portion of the carrier main body of the lower temporary packing product as seen in a planar view.

3. The buffer material according to claim 1, wherein an opening portion that enables visual confirmation of an upper surface of the wafer carrier therefrom is provided in the upper surface of the upper buffer body.

4. The buffer material according to claim 1, wherein the upper concave portion of the upper buffer body is formed into a square shape as seen in a bottom view, and a notch is provided at each corner portion of the upper concave portion.

5. The buffer material according to claim 2, wherein, when the surface of the lower buffer body having the shock absorbing protrusions formed thereon and the surface of the upper buffer body having the upper concave portion formed thereon are arranged to overlap each other, the shock absorbing protrusions are allowed to be accommodated in the upper concave portion.

6. The buffer material according to claim 5, wherein each of the shock absorbing protrusions of the lower buffer body is formed into an L-like shape as seen in a bottom view.

7. The buffer material according to claim 1, wherein each of the upper buffer body and the lower buffer body is made of foam of polyethylene, polypropylene, or polystyrene.

8. The buffer material according to claim 1, wherein the wafer carrier is a front opening shipping box.

9. A buffer material for packing a wafer carrier, the buffer material comprising an upper buffer body and a lower buffer body that are arranged above and below a wafer carrier at the time of packing the wafer carrier in a container, the wafer carrier comprising: a box-like carrier main body that has an access opening formed in an upper surface thereof and a frame-like step portion formed on an upper inner peripheral surface of the access opening, and stores wafers therein; and a lid body that closes the access opening in an openable manner when it is accommodated in the frame-like step portion through a gasket,
    wherein the upper buffer body comprises: an upper concave portion that is formed on a lower surface thereof and accommodates an upper portion of the wafer carrier; and a pressing rib that is brought into contact with an upper end surface of the carrier main body and pressed against the upper end surface of the carrier main body without contacting the lid body, and
    the lower buffer body comprises: a lower concave portion that is formed on an upper surface thereof and accommodates a lower portion of the carrier main body; and a support portion that is brought into contact with the lower portion of the carrier main body and supports the lower portion of the carrier main body in the lower concave portion; and wherein a plurality of shock absorbing protrusions are provided to protrude on a lower surface of the lower buffer body, a plurality of temporary packing products each having the upper buffer body and the lower buffer body sandwiching the wafer carrier therebetween are fabricated, the temporary packing products are stacked and, when the shock absorbing protrusions of the upper temporary packing product come into contact with an upper surface of the upper buffer body of the lower temporary packing product, at least part of the contact region overlaps the upper end portion of the carrier main body of the lower temporary packing product as seen in a planar view.

10. The buffer material according to claim 9, wherein, when the surface of the lower buffer body having the shock absorbing protrusions formed thereon and the surface of the upper buffer body having the upper concave portion formed thereon are arranged to overlap each other, the shock absorbing protrusions are allowed to be accommodated in the upper concave portion.

11. The buffer material according to claim 10, wherein each of the shock absorbing protrusions of the lower buffer body is formed into an L-like shape as seen in a bottom view.

\* \* \* \* \*